US012680646B2

(12) United States Patent
Tsai et al.

(10) Patent No.: US 12,680,646 B2
(45) Date of Patent: Jul. 14, 2026

(54) ADJUSTABLE ELECTRONIC DEVICE AND ROTATING SHAFT STRUCTURE THEREOF

(71) Applicant: CHICONY ELECTRONICS CO., LTD., New Taipei City (TW)

(72) Inventors: Pei-Sheng Tsai, New Taipei City (TW); Kun-Ta Tsai, New Taipei City (TW)

(73) Assignee: CHICONY ELECTRONICS CO., LTD., New Taipei City (TW)

( * ) Notice: Subject to any disclaimer, the term of this patent is extended or adjusted under 35 U.S.C. 154(b) by 388 days.

(21) Appl. No.: 18/435,477

(22) Filed: Feb. 7, 2024

(65) Prior Publication Data

US 2024/0426419 A1 Dec. 26, 2024

(30) Foreign Application Priority Data

Jun. 21, 2023 (TW) ................................. 112123547

(51) Int. Cl.
*F16M 11/06* (2006.01)
*H05K 5/02* (2006.01)

(52) U.S. Cl.
CPC ........... *F16M 11/06* (2013.01); *H05K 5/0217* (2013.01); *F16M 2200/021* (2013.01)

(58) Field of Classification Search
CPC .. F16M 11/06; F16M 2200/021; F16M 11/08; F16M 11/2028; F16M 13/02; H05K 5/0217
See application file for complete search history.

(56) References Cited

U.S. PATENT DOCUMENTS

| | | | | |
|---|---|---|---|---|
| 5,062,179 | A | * 11/1991 | Huang | ...................... B62B 9/20 |
| | | | | 403/93 |
| 6,161,982 | A | * 12/2000 | Cole | ..................... B25B 13/481 |
| | | | | 81/177.8 |
| 10,258,026 | B2 | * 4/2019 | Thomas | ............. F16M 11/2014 |
| 12,607,298 | B1 | * 4/2026 | Cifers | .................. F16M 13/022 |

* cited by examiner

*Primary Examiner* — Amy J. Sterling
(74) *Attorney, Agent, or Firm* — MUNCY, GEISSLER, OLDS & LOWE, P.C.

(57) ABSTRACT

A rotating shaft structure is applied to an adjustable electronic device. The rotating shaft structure includes a first rotating shaft, a second rotating shaft, a position limiting member and a fixing member. The position limiting member is disposed between the first rotating shaft and the second rotating shaft. The position limiting member includes a main body portion, a hollow portion and a position limiting portion. The hollow portion is through the main body portion and corresponding to a hole of the first rotating shaft. The position limiting portion is located at an inner wall of the hollow portion. The fixing member includes a head portion, a rod portion and a thread portion. The rod portion and the thread portion are inserted into the hole, the head portion is located outside the hole, and the thread portion passes through the hollow portion and connects to the second rotating shaft.

15 Claims, 8 Drawing Sheets

ADJUSTABLE ELECTRONIC DEVICE AND ROTATING SHAFT STRUCTURE THEREOF

BACKGROUND

1. Technical Field

The disclosure relates to a rotating shaft structure; more particularly, the disclosure relates to a rotating shaft structure applied to an adjustable electronic device.

2. Description of the Related Art

Generally, adjustable electronic devices are commonly used in surveillance equipment, such as image capturing devices, motion sensing devices, or illumination devices. Because the surveillance equipment needs to perform image capturing and detection or to provide illumination for a wide area, the related electronic device needs to have an adjustable rotating shaft structure. Specifically, the electronic device related to the surveillance equipment usually comprises two main components, which are respectively a main body device and an installation mount. The main body device is for example a camera, a motion sensing module or an illumination lamp. The installation mount is usually mounted to a wall or a ceiling, therefore the installation mount is generally a fixing member. The main body device and the installation mount are connected via a rotating shaft structure.

A common rotating shaft structure comprises two rotating shafts, which can be detached as well as mutually jointed in a rotatable way. The two rotating shafts are respectively connected to the main body device and the installation mount. By means of mutually rotating the two rotating shafts, the angle of the main body device can be adjusted, and thus surveillance or illumination can be provided to a specific area. After the angle adjustment is done, usually a fixing member (such as a screw or a lock) would be used to fix the two rotating shafts, so as to fix the angle of the main body device.

When there is a need to adjust to another angle, it is required to loosen the fixing member first, so that the two rotating shafts can be detached for further angle adjustment. However, because the interior of the rotating shaft structure has wires for electric connection, in the event the two rotating shafts fall apart while they are detached, the wires inside would be dragged or even damaged. Or, if the electronic device is broken due to an external force, which makes one of the rotating shafts fall apart together with the main body device, the wires could also be damaged as well. Therefore, there is a need to provide an adjustable electronic device and a rotating shaft structure thereof to mitigate and/or obviate the aforementioned problems.

SUMMARY

It is an object of the disclosure to provide an adjustable electronic device and a rotating shaft structure thereof. By means of the novel structure of a position limiting member and a fixing member of the rotating shaft structure, the problem of damaged wires caused when the rotating shafts of a conventional rotating shaft structure are detached can be resolved accordingly.

To achieve the abovementioned objects, the disclosure provides a rotating shaft structure applied to an adjustable electronic device. The rotating shaft structure comprises a first rotating shaft, a second rotating shaft, a position limiting member and a fixing member. The first rotating shaft comprises a hole and a first connecting surface. The second rotating shaft comprises a second connecting surface connected to the first connecting surface. The position limiting member is disposed between the first rotating shaft and the second rotating shaft. The position limiting member includes a main body portion, a hollow portion and a position limiting portion. The hollow portion is through the main body portion and corresponding to the hole. The position limiting portion is located at an inner wall of the hollow portion and at one side of which close to the first rotating shaft. The fixing member includes a head portion, a rod portion and a thread portion. The rod portion is located between the head portion and the thread portion. An outer diameter of the thread portion is greater than an outer diameter of the rod portion. The rod portion and the thread portion are inserted into the hole, the head portion is located outside the hole, and the thread portion passes through the hollow portion and connects to the second rotating shaft. When the first rotating shaft and the second rotating shaft are detached, one end of the thread portion which is close to the rod portion props against the position limiting portion.

To achieve the abovementioned objects, the disclosure further provides an adjustable electronic device, which comprises a first casing, a second casing and a rotating shaft structure. The rotating shaft structure comprises a first rotating shaft, a second rotating shaft, a position limiting member and a fixing member. One end of the first rotating shaft is connected to the first casing. The first rotating shaft includes a hole and a first connecting surface. One end of the second rotating shaft is connected to the second casing, and the second rotating shaft includes a second connecting surface. The second connecting surface is connected to the first connecting surface. The position limiting member is disposed between the first rotating shaft and the second rotating shaft. The position limiting member includes a main body portion, a hollow portion and a position limiting portion. The hollow portion is through the main body portion and corresponding to the hole. The position limiting portion is located at an inner wall of the hollow portion and at one side of which close to the first rotating shaft. The fixing member includes a head portion, a rod portion and a thread portion. The rod portion is located between the head portion and the thread portion. An outer diameter of the thread portion is greater than an outer diameter of the rod portion. The rod portion and the thread portion are inserted into the hole, the head portion is located outside the hole, and the thread portion passes through the hollow portion and connects to the second rotating shaft. When the first rotating shaft and the second rotating shaft are detached, one end of the thread portion which is close to the rod portion props against the position limiting portion.

In an embodiment of the disclosure, when the fixing member is rotated along a predetermined direction, the thread portion is screwed to the second rotating shaft. When the fixing member is rotated along a reversed direction, the rod portion moves out from the hollow portion, the first rotating shaft and the second rotating shaft are detached, and one end of the thread portion which is close to the rod portion props against the position limiting portion.

In an embodiment of the disclosure, the position limiting member is disposed at the second connecting surface of the second rotating shaft. The second rotating shaft further includes a keyhole, and the keyhole is mutually communicated with the hollow portion.

In an embodiment of the disclosure, the position limiting member further comprises a first positioning portion connected to the main body portion. The second rotating shaft further comprises a second positioning portion located at the second connecting surface and adjacent to the keyhole. The first positioning portion is connected to the second positioning portion.

In an embodiment of the disclosure, the hollow portion comprises a neck section and a moving section. The neck section is corresponding to the position limiting portion. An inner diameter of the neck section is smaller than an inner diameter of the moving section, and the outer diameter of the thread portion is greater than the inner diameter of the neck section.

In an embodiment of the disclosure, when one end of the thread portion props against the position limiting portion, the distance between the first connecting surface and the second connecting surface is substantially equal to a height of the moving section.

In an embodiment of the disclosure, the first rotating shaft further comprises a first annular tooth slot located at the first connecting surface, the second rotating shaft further comprises a second annular tooth slot located at the second connecting surface, and the first annular tooth slot and the second annular tooth slot are engaged with each other.

In an embodiment of the disclosure, the first annular tooth slot comprises a plurality of tooth-shaped structures, and the tooth-shaped structures are spaced in intervals. The height of the moving section is greater than a width of one of the tooth-shaped structures.

In an embodiment of the disclosure, the hole and the fixing member are located at a central position of the first annular tooth slot.

In an embodiment of the disclosure, the rotating shaft structure further comprises a first waterproof ring, which is disposed between the first connecting surface of the first rotating shaft and the second connecting surface of the second rotating shaft.

In an embodiment of the disclosure, the first waterproof ring is disposed at the first connecting surface of the first rotating shaft. The second rotating shaft further comprises a protrusion, and the protrusion presses against the first waterproof ring.

In an embodiment of the disclosure, the rotating shaft structure further comprises a second waterproof ring, which is disposed at the periphery of the hole of the first rotating shaft, and the head portion of the fixing member presses against the second waterproof ring.

In an embodiment of the disclosure, the adjustable electronic device comprises a first casing and a second casing. One end of the first rotating shaft is connected to the first casing, and one end of the second rotating shaft is connected to the second casing.

In an embodiment of the disclosure, the rotating shaft structure further comprises at least two third waterproof rings, respectively disposed between the first rotating shaft and the first casing, and between the second rotating shaft and the second casing.

According to the abovementioned description, the disclosure provides an adjustable electronic device and a rotating shaft structure thereof. The rotating shaft structure comprises a first rotating shaft, a second rotating shaft, a position limiting member and a fixing member. The position limiting member is disposed between the first rotating shaft and the second rotating shaft. The position limiting member comprises a main body portion, a hollow portion and a position limiting portion. The hollow portion is through the main portion. The position limiting portion is located at an inner wall of the hollow portion and at one side of which close to the first rotating shaft. The fixing member includes a head portion, a rod portion and a thread portion. The rod portion is located between the head portion and the thread portion. An outer diameter of the thread portion is greater than an outer diameter of the rod portion. Therefore, the thread portion passes through the hollow portion and connects to the second rotating shaft, such that the first rotating shaft and the second rotating shaft can be mutually mounted. When the first rotating shaft and the second rotating shaft are detached, one end of the thread portion props against the position limiting portion, such that the position limiting member can limit the positions of the fixing member and the first rotating shaft. According to the abovementioned structure, when the first rotating shaft and the second rotating shaft are detached, the distance between the two shafts can be limited, so as to avoid dragging the wires inside, and therefore achieve the effect of preventing the wires from being damaged.

DETAILED DESCRIPTION OF THE EMBODIMENTS

In order to make the structure, characteristics, and effectiveness of the disclosure further understood and recognized, a detailed description of the disclosure is provided as follows, along with embodiments and accompanying figures.

Figure 1:
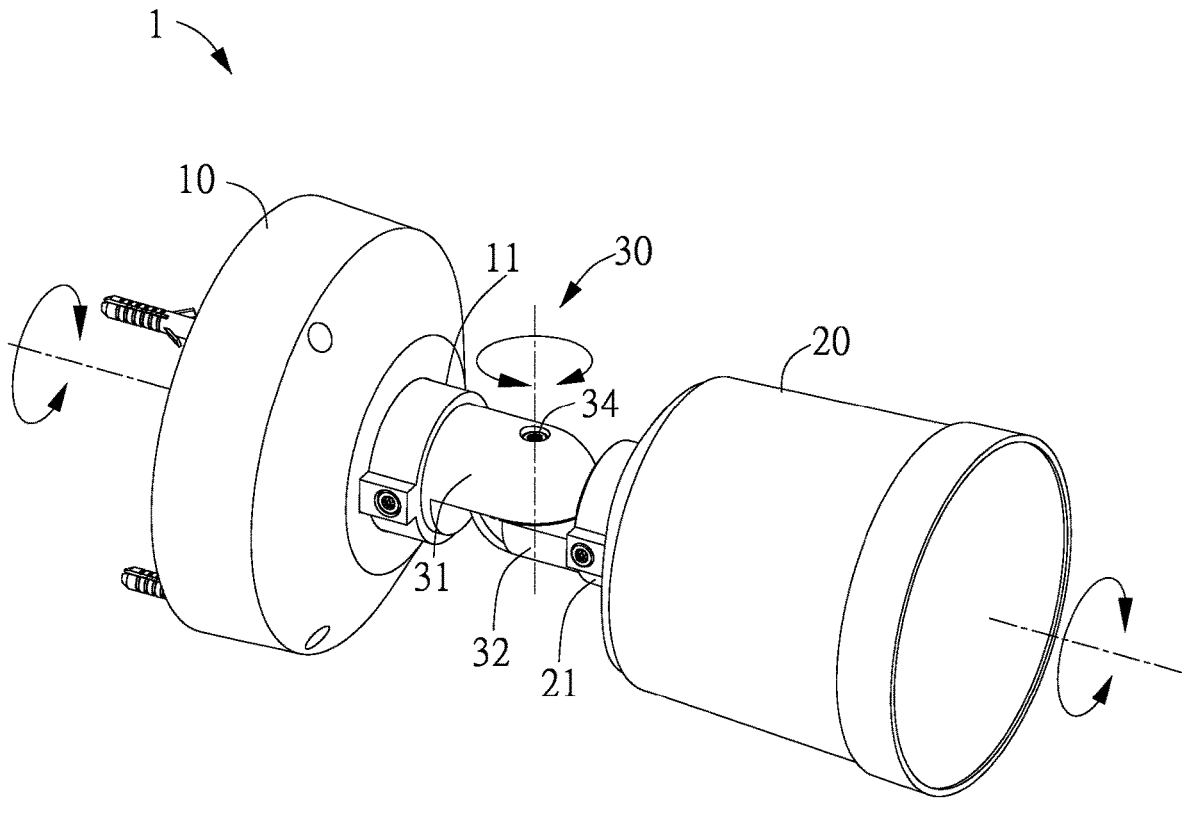
FIG. 1 illustrates a schematic drawing of an adjustable electronic device according to one embodiment of the disclosure.
Figure 2:
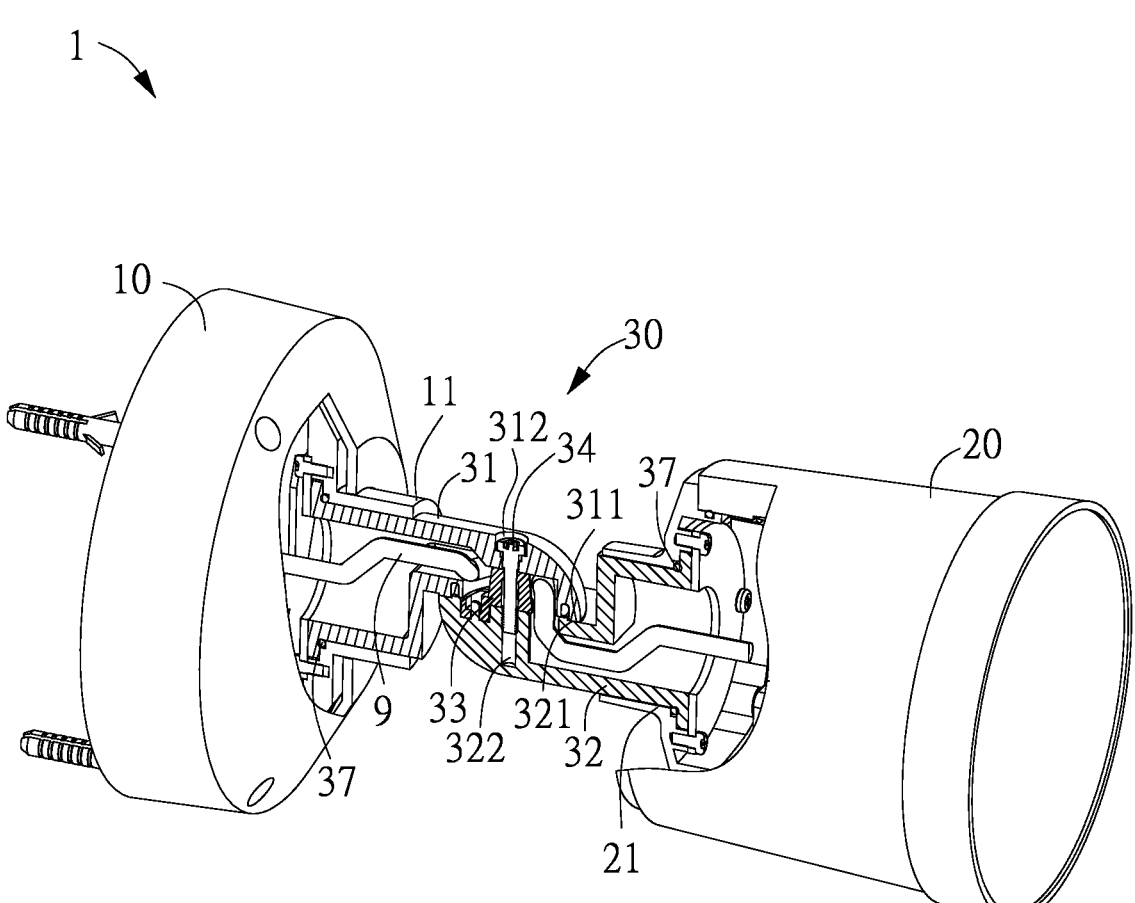
FIG. 2 illustrates a sectional view of the adjustable electronic device as shown in FIG. 1.
Figure 3:
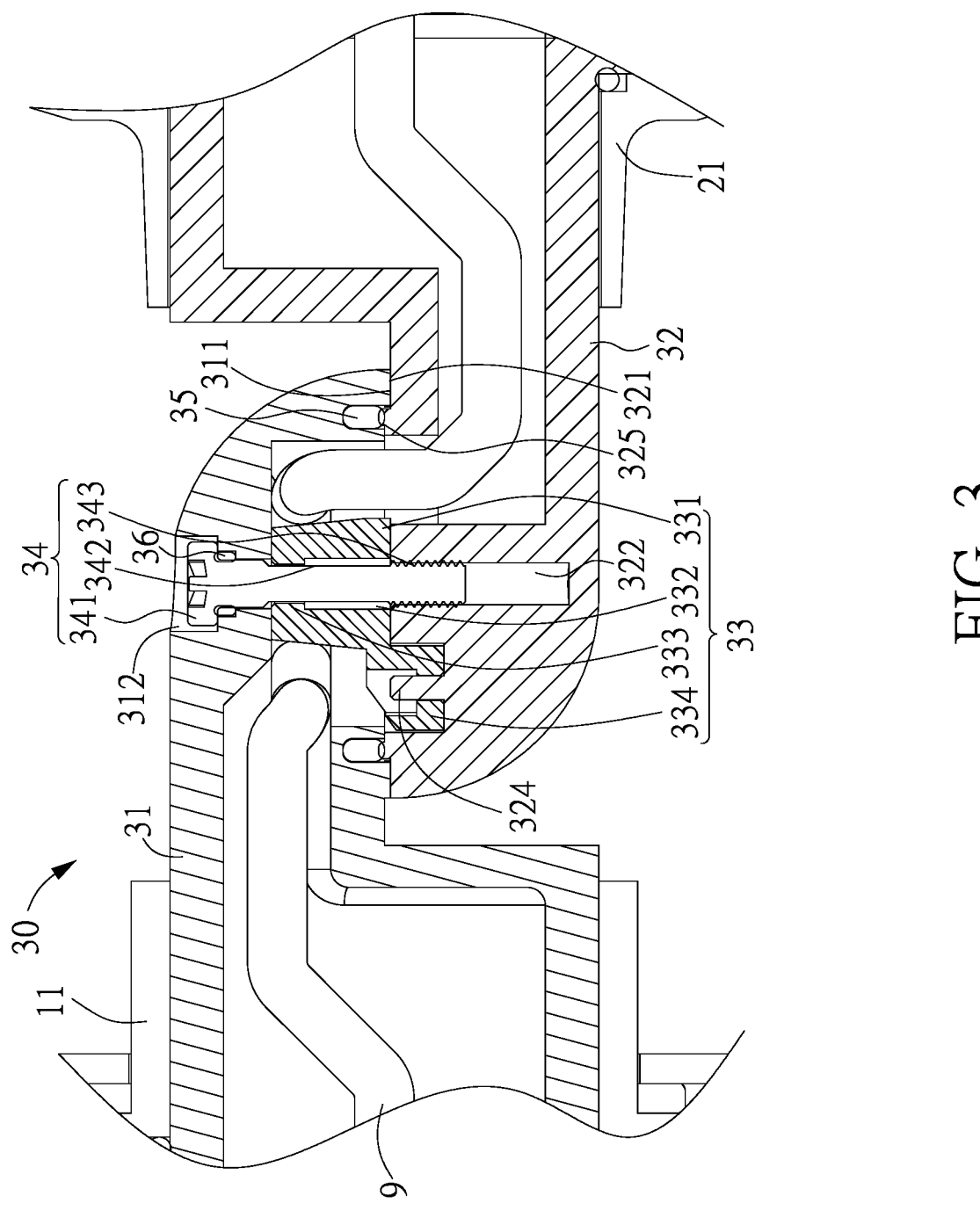
FIG. 3 illustrates an enlarged schematic drawing of the rotating shaft structure as shown in FIG. 2.
Figure 4:
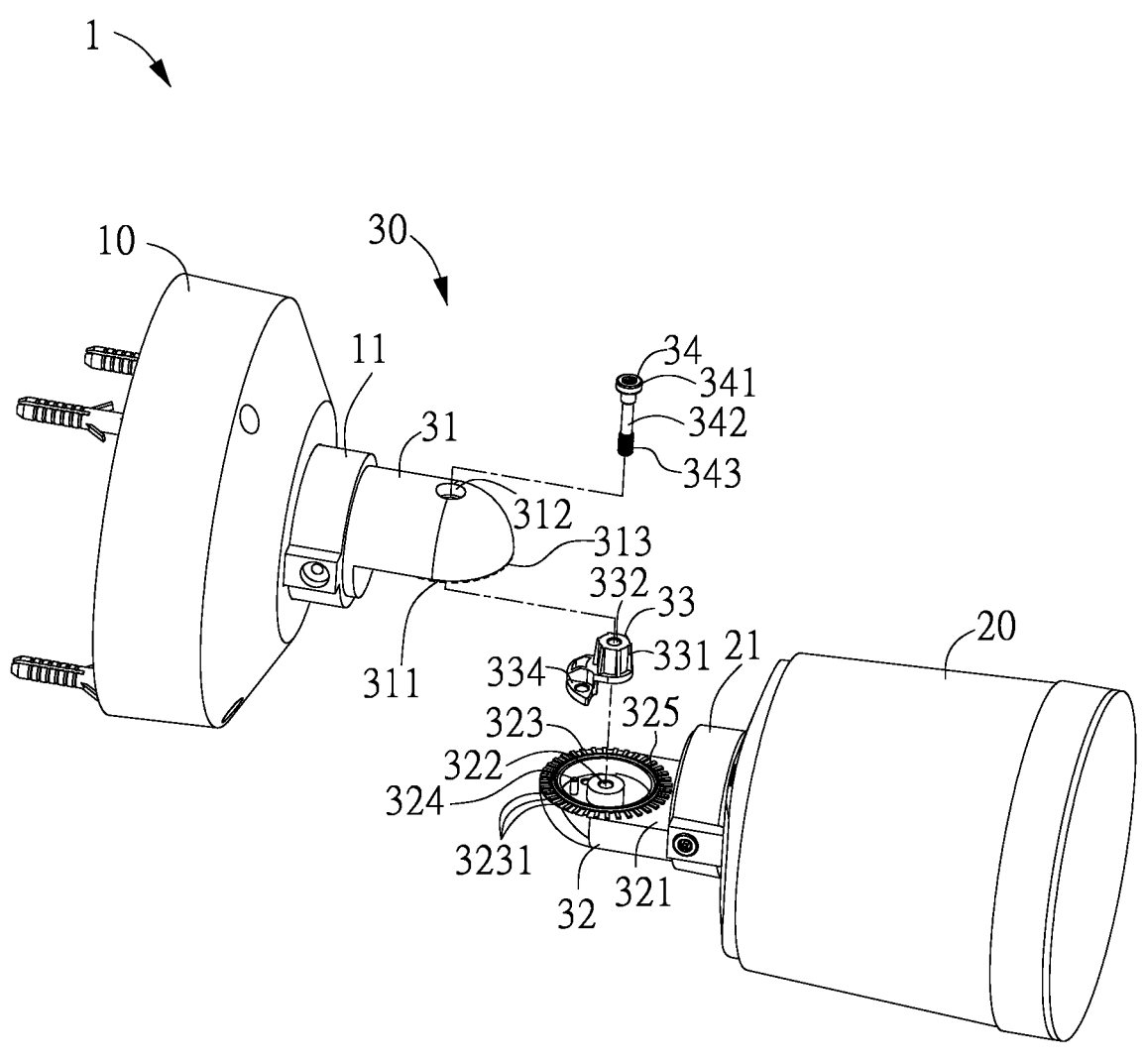
FIG. 4 illustrates an exploded view of the adjustable electronic device as shown in FIG. 1.

FIG. 1 illustrates a schematic drawing of an adjustable electronic device according to one embodiment of the disclosure; FIG. 2 illustrates a sectional view of the adjustable electronic device as shown in FIG. 1; FIG. 3 illustrates an enlarged schematic drawing of the rotating shaft structure as shown in FIG. 2; and FIG. 4 illustrates an exploded view of the adjustable electronic device as shown in FIG. 1. Refer to FIG. 1, FIG. 2, FIG. 3 and FIG. 4. First, in this embodiment, the adjustable electronic device 1 (hereinafter referred to as the electronic device 1) is mainly a device applied to the surveillance equipment. The electronic device 1 can be, for example, an image capturing device, a motion sensing device or an illumination device. The electronic device 1 comprises a first casing 10, a second casing 20 and a rotating shaft structure 30. The first casing 10 can be an installation mount, and the second casing 20 can be a casing of a main body device. For example, if the electronic device 1 is an image capturing device, the first casing 10 can be an installation mount installed onto a wall, a ceiling or other fixed object, and the second casing 20 can be a casing of a camera with an image capturing function. In other embodiments, the first casing 10 and the second casing 20 can also be arranged in a backward manner without being limited to the disclosure. Moreover, the rotating shaft structure 30 is used to connect the first casing 10 and the second casing 20, such that the second casing 20 can rotate relatively to the first casing 10, thereby adjusting the angle between the second casing 20 and the first casing 10.

More specifically, the rotating shaft structure 30 comprises a first rotating shaft 31, a second rotating shaft 32, a position limiting member 33 and a fixing member 34. One end of the first rotating shaft 31 is connected to the first casing 10, and one end of the second rotating shaft 32 is connected to the second casing 20. Preferably, the first casing 10 has a first sleeve 11, and the second casing 20 has a second sleeve 21. Further, one end of the first rotating shaft 31 and one end of the second rotating shaft 32 are cylinders, respectively. The first sleeve 11 is sleeved onto the outside of the cylinder of the first rotating shaft 31, such that the first casing 10 can rotate around the axis of the first rotating shaft 31, as shown in the arrow symbol depicted in the left-hand side of FIG. 1. Similarly, the second sleeve 21 is sleeved onto the outside of the cylinder of the second rotating shaft 32, such that the second casing 20 can rotate around the axis of the second sleeve 21, as shown in the arrow symbol depicted in the right-hand side of FIG. 1.

Moreover, the first rotating shaft 31 comprises a first connecting surface 311, and the second rotating shaft 32 comprises a second connecting surface 321. The first connecting surface 311 is located at a surface of the first rotating shaft 31, and the second connecting surface 321 is located at a surface of the second rotating shaft 32 which is corresponding to the first connecting surface 311. In this embodiment, the first connecting surface 311 is located at the lower surface of the first rotating shaft 31, and the second connecting surface 321 is located at the upper surface of the second rotating shaft 32. Upon assembly of the rotating shaft structure 30, the first connecting surface 311 of the first rotating shaft 31 can correspond to the second connecting surface 321 of the second rotating shaft 32, and the fixing member 34 is used to fix the first rotating shaft 31 and the second rotating shaft 32. Therefore, the second connecting surface 321 is connected to the first connecting surface 311, and the first rotating shaft 31 can rotate relatively to the second rotating shaft 32 around the axis of the fixing member 34; or, the second rotating shaft 32 can rotate relatively around the first rotating shaft 31 around the axis of the fixing member 34, as shown in the arrow symbol depicted next to the rotating shaft structure 30 of FIG. 1. By means of rotating the first rotating shaft 31 or the second rotating shaft 32 around the axis of the fixing member 34, the angle between the first casing 10 and the second casing 20 can be adjusted accordingly.

Figure 5:
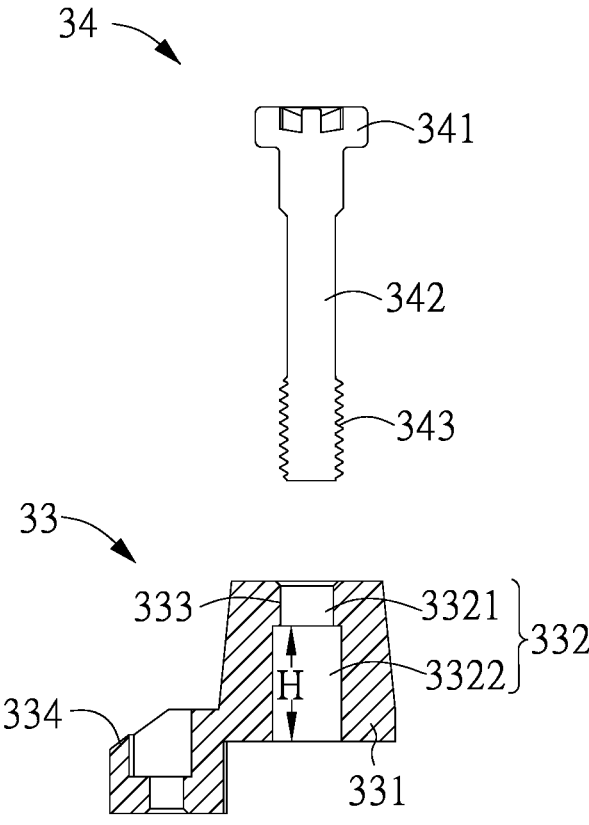
FIG. 5 illustrates a sectional view of the position limiting member and the fixing member as shown in FIG. 4.

In this embodiment, the first rotating shaft 31 further comprises a hole 312. The fixing member 34 can pass through the hole 312 and the position limiting member 33, so as to connect to the second rotating shaft 32. Specifically, the position limiting member 33 is disposed between the first rotating shaft 31 and the second rotating shaft 32. In this embodiment, the position limiting member 33 is disposed at the second connecting surface 321 of the second rotating shaft 32. FIG. 5 illustrates a sectional view of the position limiting member and the fixing member as shown in FIG. 4. Refer to FIG. 3, FIG. 4 and FIG. 5. In this embodiment, the position limiting member 33 comprises a main body portion 331, a hollow portion 332 and a position limiting portion

333. The hollow portion 332 is through the main body portion 331, and the hollow portion 332 is corresponding to the hole 312 of the first rotating shaft 31. The position limiting portion 333 is located at an inner wall of the hollow portion 332 and at one side of which close to the first rotating shaft 31. In this embodiment, the position limiting portion 333 is a protrusion extending from the inner wall toward the center of the hollow portion 332, such that the hollow portion 332 can be divided into two sections. As shown in FIG. 5, the upper side of the hollow portion 332 (i.e., the side adjacent to the first rotating shaft 31) is a neck section 3321, which has a smaller inner diameter; and the lower side of the hollow portion 332 is a moving section 3322, which has a greater inner diameter. In other words, the hollow portion 332 of this embodiment includes a neck section 3321 and a moving section 3322, wherein the neck section 3321 is corresponding to the position limiting portion 333, and therefore the inner diameter of the neck section 3321 is smaller than the inner diameter of the moving section 3322.

In this embodiment, the fixing member 34 comprises a head portion 341, a rod portion 342 and a thread portion 343. The rod portion 342 is located between the head portion 341 and the thread portion 343. The outer diameter of the head portion 341 is greater than that of the rod portion 342 and the thread portion 343, and the outer diameter of the head portion 341 is greater than the inner diameter of the hole 312 of the first rotating shaft 31. Furthermore, the outer diameter of the thread portion 343 is greater than the outer diameter of the rod portion 342. Upon assembly of the fixing member 34, the rod portion 342 and the thread portion 343 can be inserted into the hole 312, and the head portion 341 is located outside the hole 312. The rod portion 342 and the thread portion 343 passes through the hole 312 and then enters the hollow portion 332, and the thread portion 343 located at the bottom end passes through the hollow portion 332 to further connect to the second rotating shaft 32.

In this embodiment, the second rotating shaft 32 and the position limiting member 33 are made of materials, such as plastic or metal, that allow the thread portion 343 to self-tap its own hole. Specifically, in this embodiment, the outer diameter of the thread portion 343 is greater than the inner diameter of the neck section 3321 of the hollow portion 332, and is smaller than the inner diameter of the moving section 3322 of the hollow portion 332. After the thread portion 343 passes through the hole 312, the fixing member 34 is rotated along a predetermined direction (for example, the clockwise direction), so that the thread portion 343 can be screwed to the inner wall of the neck section 3321, and can further enter the moving section 3322. Next, the fixing member 34 keeps being rotated, so that the thread portion 343 can be screwed to the second rotating shaft 32. That is, when the fixing member 34 is rotated along the clockwise direction (i.e., the predetermined direction), the thread portion 343 can pass through the hollow portion 332 and can be screwed to the second rotating shaft 32, as shown in FIG. 2 and FIG. 3.

Preferably, the second rotating shaft 32 of this embodiment further comprises a keyhole 322. The keyhole 322 is mutually connected with the hollow portion 332 of the position limiting member 33, and the outer diameter of the thread portion 343 is greater than the inner diameter of the keyhole 322. As stated above, after the thread portion 343 passes through the hollow portion 332, the fixing member 34 keeps being rotated along the clockwise direction (i.e., the predetermined direction), such that the thread portion 343 is screwed into the keyhole 322. In other embodiments, the end portion of the thread portion 343 can also be designed as a sharp head for being screwed to the first rotating shaft 31 directly without the need of the keyhole 322 structure.

Figure 6:
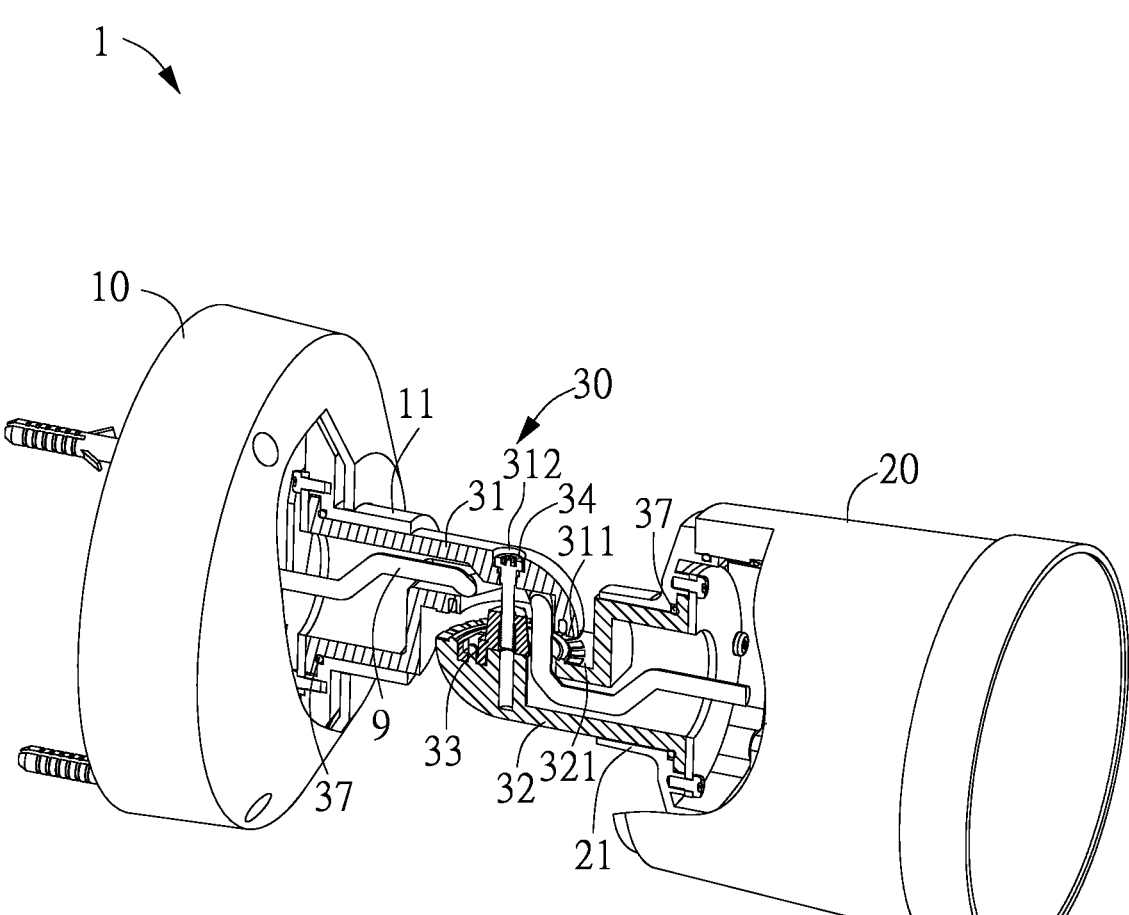
FIG. 6 illustrates a schematic drawing depicting the first rotating shaft and the second rotating shaft of FIG. 2 being detached.
Figure 7:
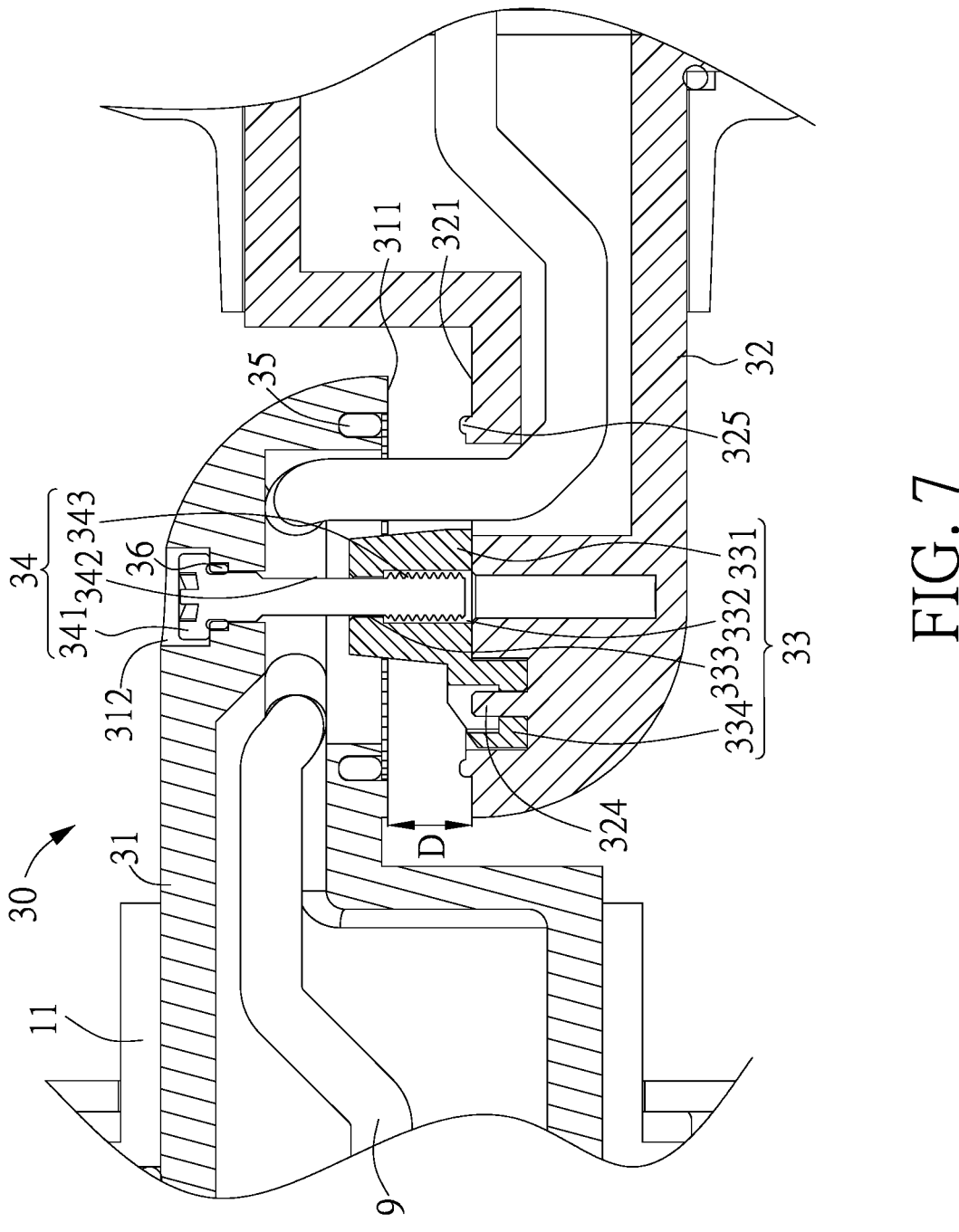
FIG. 7 illustrates an enlarged schematic drawing of the rotating shaft structure as shown in FIG. 6.

When the thread portion 343 of the fixing member 34 is connected to the second rotating shaft 32, the first rotating shaft 31 and the second rotating shaft 32 are mutually mounted, and thus the angle between the first casing 10 and the second casing 20 is fixed as well. FIG. 6 illustrates a schematic drawing depicting the first rotating shaft and the second rotating shaft of FIG. 2 being detached; and FIG. 7 illustrates an enlarged schematic drawing of the rotating shaft structure as shown in FIG. 6. Refer to FIG. 6 and FIG. 7. When there is a need to adjust the angle between the first casing 10 and the second casing 20, it is required to firstly loosen the fixing member 34, so as to detach the first rotating shaft 31 and the second rotating shaft 32. For example, by means of rotating the fixing member 34 along the counterclockwise direction, the fixing member 34 would be rotated in a reversed direction. At this time, the fixing member 34 would gradually move out from the hole 312, wherein the rod portion 342 would move out from the hollow portion 332 till one end of the thread portion 343 which is close to the rod portion 342 props against the position limiting portion 333, as shown in FIG. 6 and FIG. 7. Meanwhile, the first rotating shaft 31 and the second rotating shaft 32 is detached. Further, when the first rotating shaft 31 or the second rotating shaft 32 is detached, because one end of the thread portion 343 (which is close to the rod portion 342) props against the position limiting portion 333, it can therefore limit the distance between the first rotating shaft 31 and the second rotating shaft 32 when they are detached. In other words, the position limiting member 33 can limit the positions of the fixing member 34 and the first rotating shaft. As a result, when the first rotating shaft 31 or the second rotating shaft 32 is detached, the distance between the first connecting surface 311 and the second connecting surface 321 can be limited accordingly.

According to the abovementioned structure, by means of limiting the distance between the first rotating shaft 31 and the second rotating shaft 32 when they are detached, damages caused to the wires 9 inside can therefore be prevented. Specifically, wires 9 used for electric connection are provided between the first casing 10 and the second casing 20, and pass through the interior of the rotating shaft structure 30. Which means, the wires 9 pass through the first rotating shaft 31 and the second shaft 32, as shown in FIG. 2 and FIG. 3. By means of utilizing the position limiting member 33 to limit the positions of the fixing member 34 and the first rotating shaft 31, the situation of dragging the wires 9 inside and further causing damages due to the overlong distance between the first rotating shaft 31 and the second rotating shaft 32 when they are detached can be avoided. Or, if the electronic device 1 is broken due to an external force, the structure of the position limiting member 33 and the fixing member 34 can also avoid the situation that the second rotating shaft 32 falls apart together with the second casing 20 (i.e., the main body device), thereby preventing the wires 9 inside from being damaged.

Figure 8:
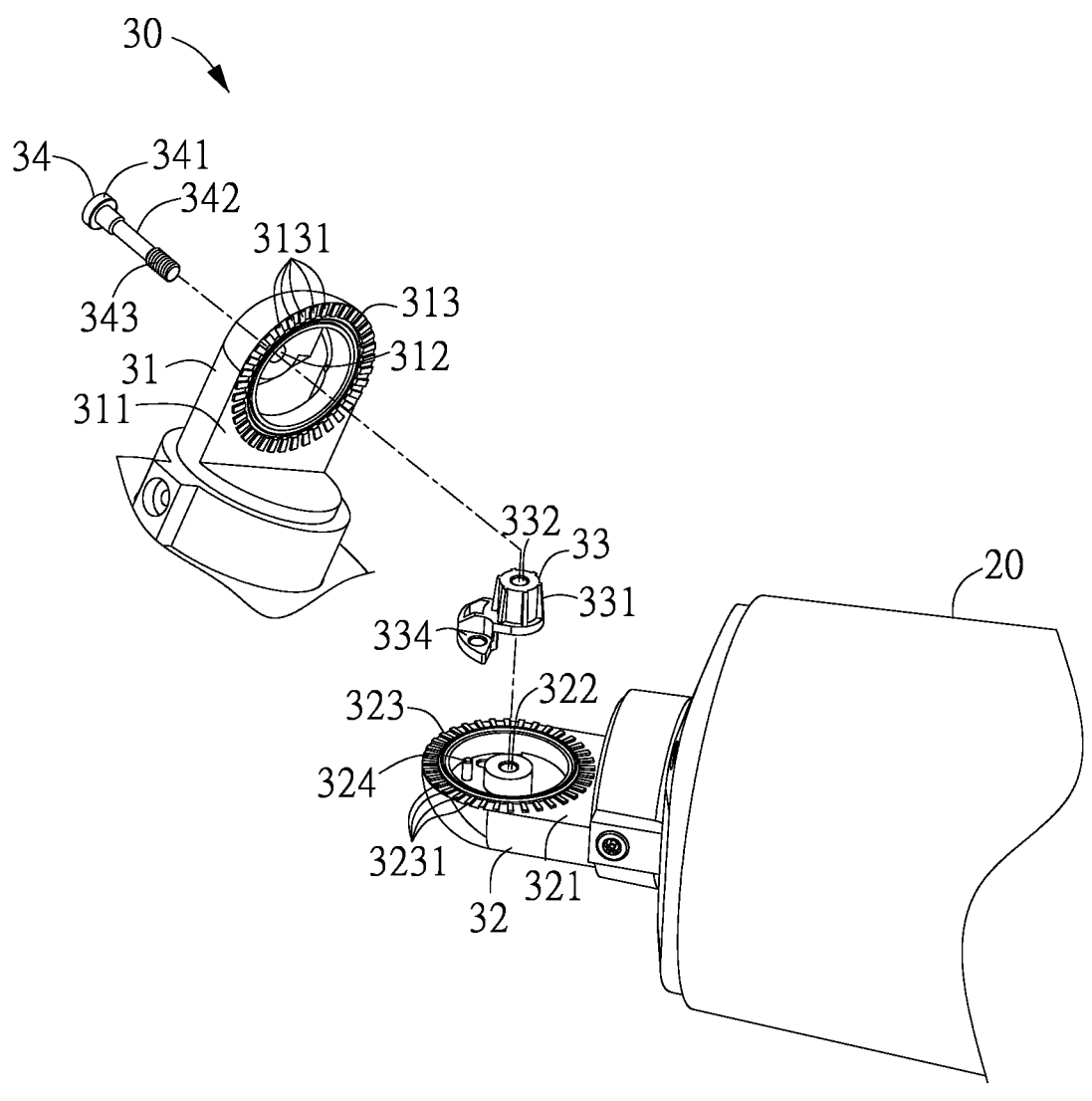
FIG. 8 illustrates a schematic drawing of the rotating shaft structure of FIG. 4 at another angle.

FIG. 8 illustrates a schematic drawing of the rotating shaft structure of FIG. 4 at another angle. With reference to FIG. 4 and FIG. 8. In this embodiment, the first rotating shaft 31 further comprises a first annular tooth slot 313 located at the first connecting surface 311. Correspondingly, the second rotating shaft 32 further comprises a second annular tooth slot 323 located at the second connecting surface 321. The first annular tooth slot 313 and the second annular tooth slot 323 are engaged with each other, such that the first connecting surface 311 can be connected to the second connecting surface 321 in a rotatable way, in order to adjust the angle between the first rotating shaft 31 and the second rotating shaft 32. Specifically, the first annular tooth slot 313 includes a plurality of tooth-shaped structures 3131, wherein the tooth-shaped structures 3131 are spaced in intervals. Likewise, the second annular tooth slot 323 also includes a plurality of tooth-shaped structures 3231, wherein the tooth-shaped structures 3231 are spaced in intervals. The tooth-shaped structures 3131 of the first annular tooth slot 313 are placed between two adjacent tooth-shaped structures 3231 of the second annular tooth slot 323, such that the first annular tooth slot 313 and the second annular tooth slot 323 are engaged with each other.

Preferably, the hole 312 is located at a central position of the first annular tooth slot 313, that is, the circle center of the first annular tooth slot 313. Correspondingly, the position limiting member 33 is also disposed at the center of the second annular tooth slot 323, and the hollow portion 332 is corresponding to the central position (i.e., the circle center) of the second annular tooth slot 323. Therefore, after the fixing member 34 is inserted into the hole 312 and the hollow portion 322, the fixing member 34 can be located at the central positions of the first annular tooth slot 313 and the second annular tooth slot 323, such that the rotation between the first rotating shaft 31 and the second rotating shaft 32 can be smoother.

In this embodiment, when the first rotating shaft 31 and the second rotating shaft 32 are detached, and one end of the thread portion 343 props against the position limiting portion 333, the distance D (as shown in FIG. 7) between the first connecting surface 311 and the second connecting surface 321 is substantially equal to a height H (as shown in FIG. 5) of the moving section 3322. In other words, the maximum detached distance D between the first rotating shaft 31 and the second rotating shaft 32 is substantially equal to the height H. Therefore, the height H of the moving section 3322 can be defined according to the predicted distance D between the first connecting surface 311 and the second connecting surface 321 when the first rotating shaft 31 and the second rotating shaft 32 are detached. For example, if the predicted distance D between the first connecting surface 311 and the second connecting surface 321 is 1 cm when the first rotating shaft 31 and the second rotating shaft 32 are detached, then the height H of the moving section 3322 can be designed as 1 cm. The height H of the moving section 3233 is greater than a width of one of the tooth-shaped structures 3131 of the first annular tooth slot 313 (or one of the tooth-shaped structures 3231 of the second annular tooth slot 323), so as to make sure the fixing member 34 can be released in order to adjust the angle between the first rotating shaft 31 and the second rotating shaft 32.

Preferably, the position limiting member 33 further comprises a first positioning portion 334 connected to the main body portion 331. In this embodiment, the first positioning portion 334 is disposed adjacent to the main body portion 331. Correspondingly, the second rotating shaft 32 further comprises a second positioning portion 324 located at the second connecting surface 321 and adjacent to the keyhole 322. When the position limiting member 33 is assembled to the second rotating shaft 32, the first positioning portion 334 can firstly be used to connect to the second positioning portion 324, and then the hollow portion 332 would be corresponded to the keyhole 322. In this embodiment, the first positioning portion 334 has a positioning hole, and the second positioning portion 324 is corresponding to a positioning pillar, such that the first positioning portion 334 can use its positioning hole to pass through the second positioning portion 324 (i.e., the positioning pillar). In other embodiments, it is also applicable that the first positioning portion 334 has a positioning pillar and the second positioning portion 324 is corresponding to a positioning hole without limiting the scope of the disclosure.

Preferably, in this embodiment, the second positioning portion 324 is located between the keyhole 322 and the second annular tooth slot 323. As shown in FIG. 4, along the radial direction of the second annular tooth slot 323 and starting from the central position (i.e., the circle center), the keyhole 322, the second positioning portion 324 and the second annular tooth slot 323 are arranged in sequence. Preferably, the keyhole 322 is located at the central position (i.e., the circle center) of the second annular tooth slot 323. Because the second positioning portion 324 is located between the keyhole 322 and the second annular tooth slot 323, the rotation between the first annular tooth slot 313 and the second annular tooth slot 323 would not be affected when the first positioning portion 334 is assembled and connected to the second positioning portion 324.

Preferably, the first positioning portion 334 can further have a keyhole for a screw to pass through, therefore the position limiting member 33 can be fixed to the second rotating shaft 32 by means of screw lock. In another embodiment, the position limiting member 33 can also be fixed to the second rotating shaft 32 by means of adherence. In yet another embodiment, the position limiting member 33 and the second rotating shaft 32 can be a one-piece structure. For example, the position limiting member 33 and the second rotating shaft 32 are formed simultaneously via injection molding. Moreover, the second rotating shaft 32 and the position limiting member 33 can also be formed via double injection molding without limiting the scope of the disclosure.

Preferably, the rotating shaft structure 30 can comprise a plurality of waterproof rings disposed to the first rotating shaft 31, the second rotating shaft 32 or therebetween, so as to prevent water or moisture from entering into the rotating shaft structure 30. In this embodiment, the waterproof rings include first, second and third waterproof rings, respectively. Specifically, as shown in FIG. 3 and FIG. 7, the rotating shaft structure 30 further comprises a first waterproof ring 35. The first waterproof ring 35 is disposed between the first connecting surface 311 of the first rotating shaft 31 and the second connecting surface 321 of the second rotating shaft 32, so as to prevent water or moisture from entering into the rotating shaft structure 30 via the gap between the first connecting surface 311 and the second connecting surface 321. In this embodiment, the first waterproof ring 35 is disposed at the first connecting surface 311 of the first rotating shaft 31. Preferably, the second rotating shaft 32 further comprises a protrusion 325, wherein the protrusion 325 is located at the second connecting surface 321, such that the protrusion 325 can press against the first waterproof ring 35, as shown in FIG. 3. The protrusion 325 and the first waterproof ring 35 are interfered with each other, so as to increase the waterproof effect. Preferably, the protrusion 325 can be an annular structure (as shown in FIG. 4), which is corresponding to the annular structure of the first waterproof ring 35. The annular protrusion 325 can contact the first waterproof ring 35 completely, thereby further improving the waterproof effect.

In other embodiments, the first waterproof ring 35 and the protrusion 325 can also be arranged backwardly. Specifically, the first waterproof ring 35 can also be disposed to the second connecting surface 321 of the second rotating shaft

32. Correspondingly, the first rotating shaft 31 includes the protrusion 325, which is located at the first connecting surface 311 and is used for pressing against the first waterproof ring 35.

Moreover, the rotating shaft structure 30 further comprises a second waterproof ring 36. The second waterproof ring 36 is disposed at the periphery of the hole 312 of the first rotating shaft 31. Preferably, the inner wall of the hole 312 has a groove with the second waterproof ring 36 placed therein. When the fixing member 34 is inserted into the hole 312, the head portion 341 of the fixing member 34 would press against the second waterproof ring 36, thereby preventing water or moisture from entering into the rotating shaft structure 30 via the hole 312 of the first rotating shaft 31.

Further, as shown in FIG. 2 and FIG. 6, the rotating shaft structure 30 further comprises at least two third waterproof rings 37. The third waterproof rings 37 are disposed between the first rotating shaft 31 and the first casing 10, and between the second rotating shaft 32 and the second casing 20, respectively. In other words, the waterproof rings disposed between the first rotating shaft 31 and the first casing 10 and between the second rotating shaft 32 and the second casing 20 are defined as the third waterproof rings 37, wherein the third waterproof rings 37 can prevent water or moisture from entering into the rotating shaft structure 30 via the joint of the first casing 10 or the second casing 20.

Further, the disclosure also provides a rotating shaft structure, which can be applied to an adjustable electronic device. The specific structure of the rotating shaft structure and its connection relationship with the electronic device are described in detail in the abovementioned embodiments, there is no need for further description.

According to the description stated above, the disclosure provides an adjustable electronic device and a rotating shaft structure thereof. The rotating shaft structure comprises a first rotating shaft, a second rotating shaft, a position limiting member and a fixing member. The position limiting member is disposed between the first rotating shaft and the second rotating shaft. The position limiting member comprises a main body portion, a hollow portion and a position limiting portion. The hollow portion is through the main portion. The position limiting portion is located at an inner wall of the hollow portion and at one side of which close to the first rotating shaft. The fixing member includes a head portion, a rod portion and a thread portion. The rod portion is located between the head portion and the thread portion. An outer diameter of the thread portion is greater than an outer diameter of the rod portion. Therefore, the thread portion passes through the hollow portion and connects to the second rotating shaft, such that the first rotating shaft and the second rotating shaft can be mutually mounted. When the first rotating shaft and the second rotating shaft are detached, one end of the thread portion props against the position limiting portion, such that the position limiting member can limit the positions of the fixing member and the first rotating shaft. According to the abovementioned structure, when the first rotating shaft and the second rotating shaft are detached, the distance between the two shafts can be limited, so as to avoid dragging the wires inside, and therefore achieve the effect of preventing the wires from being damaged.

Although the disclosure has been explained in relation to its preferred embodiments, it is to be understood that many other possible modifications and variations can be made without departing from the spirit and scope of the disclosure as hereinafter claimed.

What is claimed is:

1. A rotating shaft structure, applied to an adjustable electronic device, the rotating shaft structure comprising:

a first rotating shaft, comprising a hole and a first connecting surface;

a second rotating shaft, comprising a second connecting surface connected to the first connecting surface of the first rotating shaft;

a position limiting member, disposed between the first rotating shaft and the second rotating shaft, wherein the position limiting member includes a main body portion, a hollow portion and a position limiting portion, the hollow portion is through the main body portion and corresponding to the hole, and the position limiting portion is located at an inner wall of the hollow portion and at one side of which close to the first rotating shaft; and a fixing member, including a head portion, a rod portion and a thread portion, wherein the rod portion is located between the head portion and the thread portion, an outer diameter of the thread portion is greater than an outer diameter of the rod portion, the rod portion and the thread portion are inserted into the hole, the head portion is located outside the hole, and the thread portion passes through the hollow portion and connects to the second rotating shaft; wherein when the first rotating shaft and the second rotating shaft are detached, one end of the thread portion which is close to the rod portion props against the position limiting portion.

2. The rotating shaft structure as claimed in claim 1, wherein when the fixing member is rotated along a predetermined direction, the thread portion is screwed to the second rotating shaft; and when the fixing member is rotated along a reversed direction, the rod portion moves out from the hollow portion, the first rotating shaft and the second rotating shaft are detached, and one end of the thread portion which is close to the rod portion props against the position limiting portion.

3. The rotating shaft structure as claimed in claim 1, wherein the position limiting member is disposed at the second connecting surface of the second rotating shaft, the second rotating shaft further includes a keyhole, and the keyhole is mutually communicated with the hollow portion.

4. The rotating shaft structure as claimed in claim 3, wherein the position limiting member further comprises a first positioning portion connected to the main body portion, the second rotating shaft further comprises a second positioning portion located at the second connecting surface and adjacent to the keyhole, and the first positioning portion is connected to the second positioning portion.

5. The rotating shaft structure as claimed in claim 1, wherein the hollow portion comprises a neck section and a moving section, the neck section is corresponding to the position limiting portion, an inner diameter of the neck section is smaller than an inner diameter of the moving section, and the outer diameter of the thread portion is greater than the inner diameter of the neck section.

6. The rotating shaft structure as claimed in claim 5, wherein when one end of the thread portion props against the position limiting portion, the distance between the first connecting surface and the second connecting surface is substantially equal to a height of the moving section.

7. The rotating shaft structure as claimed in claim 5, wherein the first rotating shaft further comprises a first annular tooth slot located at the first connecting surface, the second rotating shaft further comprises a second annular tooth slot located at the second connecting surface, and the first annular tooth slot and the second annular tooth slot are engaged with each other.

8. The rotating shaft structure as claimed in claim 7, wherein the first annular tooth slot comprises a plurality of tooth-shaped structures, the tooth-shaped structures are spaced in intervals, and the height of the moving section is greater than a width of one of the tooth-shaped structures.

9. The rotating shaft structure as claimed in claim 7, wherein the hole and the fixing member are located at a central position of the first annular tooth slot.

10. The rotating shaft structure as claimed in claim 1, further comprising:

a first waterproof ring, disposed between the first connecting surface of the first rotating shaft and the second connecting surface of the second rotating shaft.

11. The rotating shaft structure as claimed in claim 10, wherein the first waterproof ring is disposed at the first connecting surface of the first rotating shaft, the second rotating shaft further comprises a protrusion, and the protrusion presses against the first waterproof ring.

12. The rotating shaft structure as claimed in claim 1, further comprising:

a second waterproof ring, disposed at the periphery of the hole of the first rotating shaft, and the head portion of the fixing member presses against the second waterproof ring.

13. The rotating shaft structure as claimed in claim 1, wherein the adjustable electronic device comprises a first casing and a second casing, one end of the first rotating shaft is connected to the first casing, and one end of the second rotating shaft is connected to the second casing.

14. The rotating shaft structure as claimed in claim 13, further comprising:

at least two third waterproof rings, respectively disposed between the first rotating shaft and the first casing, and between the second rotating shaft and the second casing.

15. An adjustable electronic device, comprising:

a first casing;

a second casing; and a rotating shaft structure, comprising:

a first rotating shaft with one end connected to the first casing, the first rotating shaft including a hole and a first connecting surface;

a second rotating shaft with one end connected to the second casing, the second rotating shaft including a second connecting surface, and the second connecting surface being connected to the first connected surface;

a position limiting member, disposed between the first rotating shaft and the second rotating shaft, wherein the position limiting member includes a main body portion, a hollow portion and a position limiting portion, the hollow portion is through the main body portion and corresponding to the hole, and the position limiting portion is located at an inner wall of the hollow portion and at one side of which close to the first rotating shaft; and a fixing member, including a head portion, a rod portion and a thread portion, wherein the rod portion is located between the head portion and the thread portion, an outer diameter of the thread portion is greater than an outer diameter of the rod portion, the rod portion and the thread portion are inserted into the hole, the head portion is located outside the hole, and the thread portion passes through the hollow portion and connects to the second rotating shaft; wherein when the first rotating shaft and the second rotating shaft are detached, one end of the thread portion which is close to the rod portion props against the position limiting portion.

* * * * *